(12) United States Patent
Rangan et al.

(10) Patent No.: US 7,671,776 B1
(45) Date of Patent: Mar. 2, 2010

(54) INPUT SAMPLING NETWORK THAT AVOIDS UNDESIRED TRANSIENT VOLTAGES

(75) Inventors: Giri Rangan, Bangalore (IN); Bhupendra Sharma, Bangalore (IN)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/141,100

(22) Filed: Jun. 18, 2008

Related U.S. Application Data

(60) Provisional application No. 60/944,789, filed on Jun. 18, 2007.

(51) Int. Cl.
*H03M 1/66* (2006.01)
(52) U.S. Cl. .................. 341/150; 341/172; 341/144
(58) Field of Classification Search ............. 341/144, 341/150, 172, 161
See application file for complete search history.

(56) References Cited

U.S. PATENT DOCUMENTS

| 6,967,611 B2 * | 11/2005 | Atriss et al. ............... 341/172 |
| 7,009,549 B1 * | 3/2006 | Corsi .................. 341/161 |
| 7,522,086 B2 * | 4/2009 | Lee ..................... 341/172 |
| 2006/0279449 A1 * | 12/2006 | Pernici et al. ............ 341/172 |

* cited by examiner

*Primary Examiner*—Jean B Jeanglaude
(74) *Attorney, Agent, or Firm*—Townsend and Townsend and Crew LLP; J. Matthew Zigmant

(57) ABSTRACT

Circuits, methods, and apparatus that provide sampling networks that avoid undesired transient voltages. One example provides a sampling network that includes a switch such that charge is transferred to an integrator in two separate steps instead of one. This switch connects the first side of a capacitor to an intermediate voltage after it is connected to an input voltage and before it is connected to a reference voltage, where the reference voltage is the output of a one-bit digital-to-analog converter. This intermediate switching allows charge to be transferred from a sampling capacitor to an integrating capacitor in two steps, thus avoiding undesirable transient voltages.

22 Claims, 5 Drawing Sheets

INPUT SAMPLING NETWORK THAT AVOIDS UNDESIRED TRANSIENT VOLTAGES

CROSS-REFERENCES TO RELATED APPLICATIONS

This application claims the benefit of U.S. provisional patent application No. 60/944,789, titled INPUT SAMPLING NETWORK THAT AVOIDS UNDESIRED TRANSIENT VOLTAGES, by Rangan et al., filed Jun. 18, 2007, and is related to U.S. patent application number 12/141,099, titled HIGHLY LINEAR BOOTSTRAPPED SWITCH WITH IMPROVED RELIABILITY, by Sharma, filed Jun. 18, 2008, which are hereby incorporated by reference.

BACKGROUND

Sampling networks are useful building blocks that find applications in many types of integrated circuits. Common uses for sampling networks include switched capacitor filters, sample and hold circuits, track and hold circuits, and others. When combined with an integrator, they can form an input stage for a sigma-delta modulator.

Sampling networks are efficiently implemented using MOSFET transistors. As a result, sampling networks have become much more popular with the increasing use of MOSFETs in analog and mixed signal applications.

In sigma-delta modulators, two signals are added together by sampling the signals and integrating the result. In one specific example, an analog signal being converted to a digital word is sampled and a reference voltage or signal that is the output of a one-bit digital-to-analog converter is subtracted from it.

The sampling of these signals can create voltages that exceed the supply voltage ranges of an integrated circuit on which these actives are performed. This in turn can lead to transient voltages that cause parasitic diodes to conduct and clamp voltages. This causes errors in the integrated output voltage.

Accordingly, what is needed are circuits, methods, and apparatus that provide sampling networks that avoid these undesirable transient voltages.

SUMMARY

Accordingly, embodiments of the present invention provide circuits, methods, and apparatus that provide sampling networks that avoid undesired transient voltages. An exemplary embodiment of the present invention provides a sampling network that includes a switch such that charge is transferred to an integrator in two separate steps instead of one. This two step approach reduces the magnitude of resulting transient voltages.

Another exemplary embodiment of the present invention provides a sampling network having an additional switch. The additional switch connects the first side of a capacitor to an intermediate voltage after it is connected to an input voltage and before it is connected to a reference voltage, where the reference voltage is the output of a one-bit digital-to-analog converter. This intermediate switching allows charge to be transferred from a sampling capacitor to an integrating capacitor in two steps, thus avoiding undesirable transient voltages.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENTS

Figure 1:
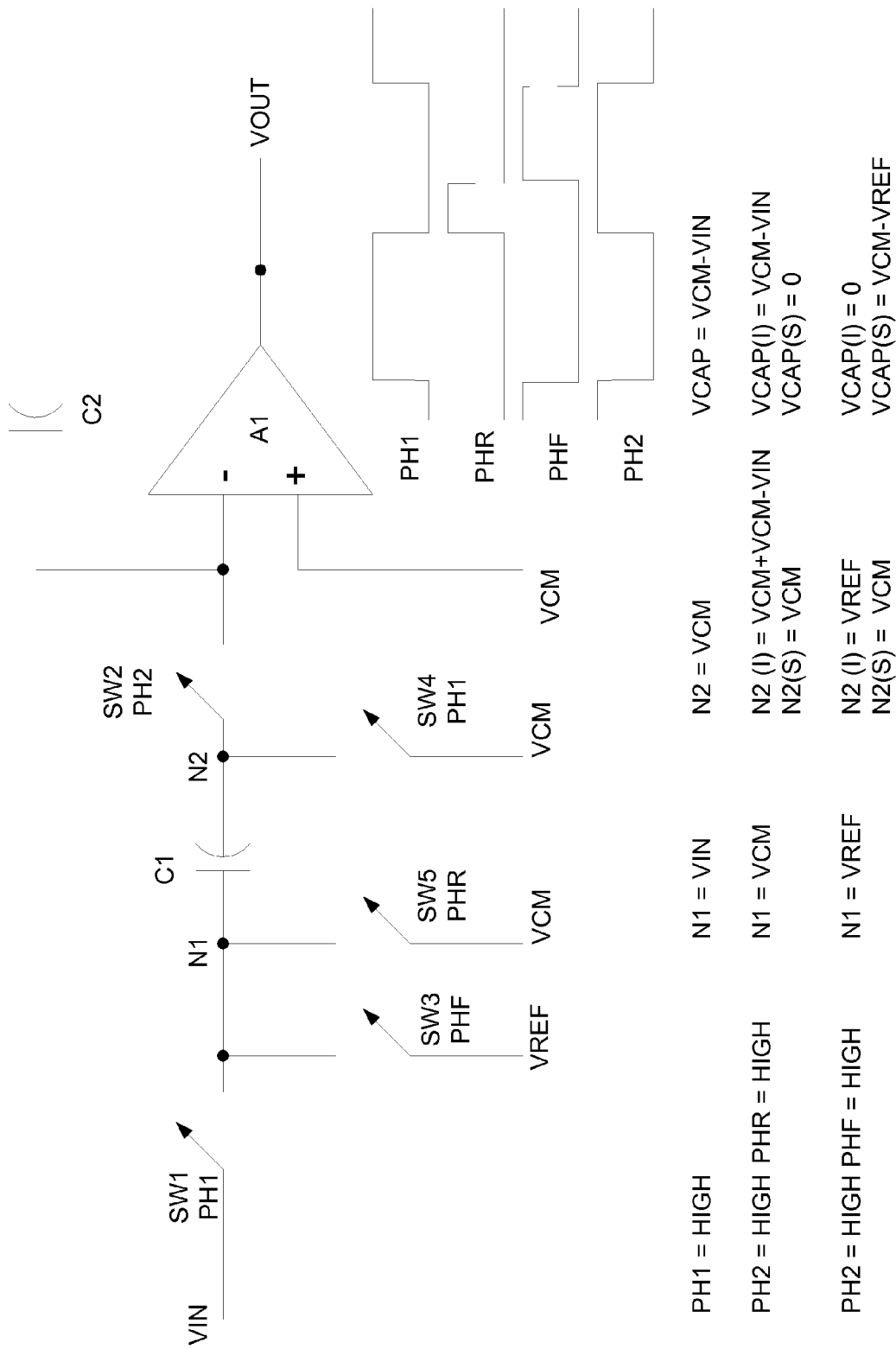
FIG. 1 is a schematic of a sampling network according to an embodiment of the present invention.

FIG. 1 is a schematic of a sampling network according to an embodiment of the present invention. The sampling network includes a sampling capacitor C1 and a number of switches, SW1, SW2, SW3, SW4, and SW5. These switches may be formed using a MOSFET or other type of transistor. Alternately, the switches may be implemented using circuits comprising multiple transistors, as well as other components, such as capacitors. For example, in a specific embodiment of the present invention, one or more of the switches are charge-boost or bootstrapped switches such as those shown in U.S. patent application Ser. No. 12/141,099, titled HIGHLY LINEAR BOOTSTRAPPED SWITCH WITH IMPROVED RELIABILITY, by Sharma, filed Jun. 18, 2008, which is hereby incorporated by reference. The sampling network is shown with an integrator that includes amplifier A1 and capacitor C2.

During operation of conventional sampling networks, charge is transferred from one capacitor to another, where it is accumulated or integrated. When charge is transferred between capacitors, large transient voltages may appear under certain signal and state conditions. These excessive voltages may be clamped or limited by parasitic diodes or other circuit elements, thereby creating errors in the integrator output voltage. Accordingly, an embodiment of the present invention transfers charge from sampling capacitor C1 to integrating capacitor C2 in two steps such that these excessive voltages are avoided.

In this embodiment of the present invention, a switch SW5 is included to connect node N1 to a common mode voltage VCM for an intermediate period of time before N1 is connected to the reference voltage VREF. In one specific embodiment of the present invention, the common mode voltage VCM is one-half the power supply voltage. For example, in an embodiment of where the power supplies are a positive power supply VCC at 5 V and ground, the common mode voltage is one-half VCC or 2.5 V. In this way, when switch SW2 closes, the charge on capacitor C1 is transferred to capacitor C2 in two steps, thereby reducing the transient voltages at node N2.

In the specific example of FIG. 1, there are four clock or control signals, PH1, PH2, PHR, and PHF. When PH1 is high, PH2 is low. Conversely, when PH2 is high, PH1 is low. These signals may be complements of each other, they may be non-overlapping clocks, or they may have other relationships to each other. When PH1 is high, both PHR and PHF are low, as is PH2. When PH1 returns low, PH2 is asserted high, as is PHR. After some period of time, PHR returns low, and signal PHF is asserted high. When PH2 returns low, PHF returns low as well. In this way, during the time PH2 is high closing switch SW2, either switch SW5 or SW3 is closed.

Specifically, when PH1 is high, switches SW1 and SW4 are closed. Thus, as shown in the first line of the table of this figure, node N1 is connected to VIN, while node N2 is connected to VCM. At this time, the voltage across the sampling capacitor C1 is equal to VCM minus VIN. It should be noted that in this table, (I) indicates an instantaneous voltage reached when a switch is closed, while (S) indicates a steady state reached some time after the switch is closed.

When PH2 is asserted high, switch SW2 is closed, and switches SW1 and SW4 are open. At this time, PHR is also high so switch SW5 is closed. Node N1 is thus equal to VCM, and the instantaneous voltage at node N2 is equal to the common mode voltage VCM added to the voltage across the capacitor, which is equal to VCM minus VIN. Accordingly, the instantaneous voltage at node N2 is equal to twice the common mode voltage VCM minus the input voltage. Again, in a specific embodiment of the present invention, VCM is equal to 2.5 V, while VIN ranges from 1 V to 4 V. Accordingly, the instantaneous voltage at node N2 can be as high as 4 V and as low as 1 V. Since these voltages are within the supply voltage range of 5V, excessive voltages that can cause clamping at node N2 do not result.

If a steady state is reached, the amplifier A1 drives its inverting input voltage to the common mode voltage VCM. At this time, each node of the capacitor has a voltage equal to VCM. In other embodiments of the present invention, PHR is on long enough to transfer some of the charge from the sampling capacitor C1 to the integrating capacitor C2, though the steady-state condition is not reached.

Later, switch SW5 opens and switch SW3 closes when PHF goes high. At this time, node N1 is connected to VREF. Since the voltage across the sampling capacitor C1 is near zero and cannot change instantaneously, the instantaneous voltage at node N2 is equal to VREF. Again, the VREF signal is provided by the output of a one-bit digital-to-analog converter having a high voltage near VCC, the supply voltage, and a low voltage near ground. Thus, the instantaneous voltage at node N2 after switch SW3 closes does not exceed the supply range and unwanted transient voltages are avoided. Once steady state is reached, node N2 returns to a voltage of VCM due to the operation of the integrator. The voltage across the capacitor is thus VCM minus VREF.

Figure 2:
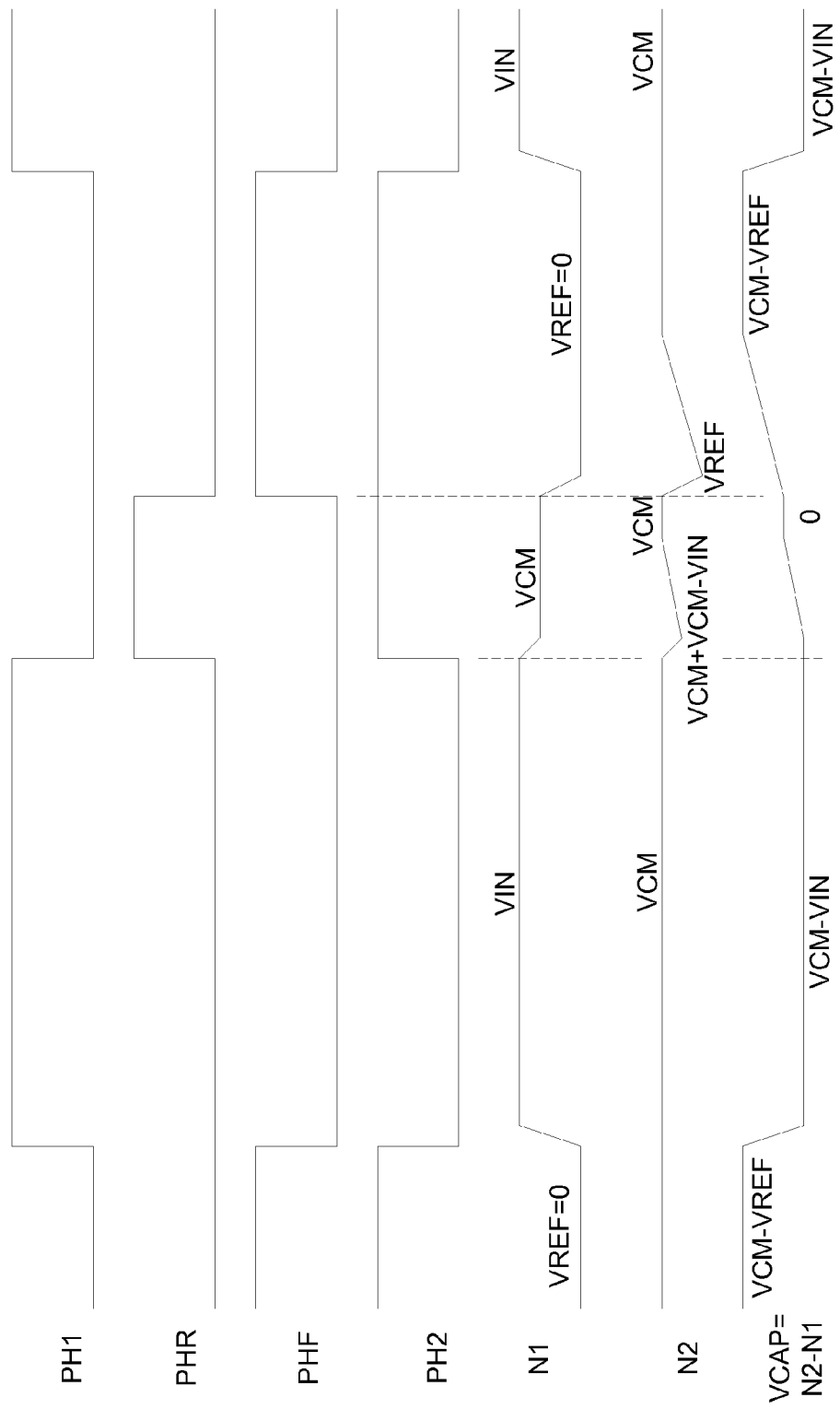
FIG. 2 is a timing diagram illustrating the operation of the circuitry in FIG. 1.

FIG. 2 is a timing diagram illustrating the operation of the circuitry in FIG. 1. In this example, the reference voltage, which may be the output from a one-bit digital-to-analog converter or comparator, is low, while the input voltage is high. When the clock signal PH1 is high, node N1 is connected to the input voltage VIN, while node N2 is connected to the common mode voltage VCM. Accordingly, the voltage across the capacitor is equal to VCM minus VIN.

When PH1 returns low, PH2 and PHR are asserted high. Accordingly, node N1 is connected to VCM, while node N2 is connected to an output terminal, which may in turn be connected to an integrator as shown in FIG. 1, or other circuitry. Again, since the voltage across the capacitor cannot change instantaneously, node N2 changes the same amount that node N1 is changed, specifically an amount equal to VCM minus VIN. Accordingly, the resulting voltage at node N2 is equal to twice VCM minus VIN. Given enough time, node N2 is driven to the voltage VCM by the integrator. At this time, the net voltage across the capacitor is zero.

When in the clock signal PHR returns low, clock signal PHF is asserted high. At this time, node N1 is connected to VREF, which in this example is zero. Node N2 remains connected to the output terminal. Again, the voltage across the capacitor cannot change instantaneously and therefore node N2 changes by the same amount as N1, specifically VREF-VCM. Once again, under steady-state conditions, node N2 reaches VCM and the difference across the capacitor is equal to VCM minus VREF.

As can be seen in this example, the voltage at node N2 does not exceed twice VCM minus VIN. Again, if VCM is 2.5V, when VIN is IV, node N2 is equal to 4.0V and when VIN is 4.0, N2 is equal to 1.0V. This range is well within the supply range, which is 5V in this example. This prevents excessive transient voltages on node N2, which may cause voltage clamping and a resulting loss of signal.

Figure 3:
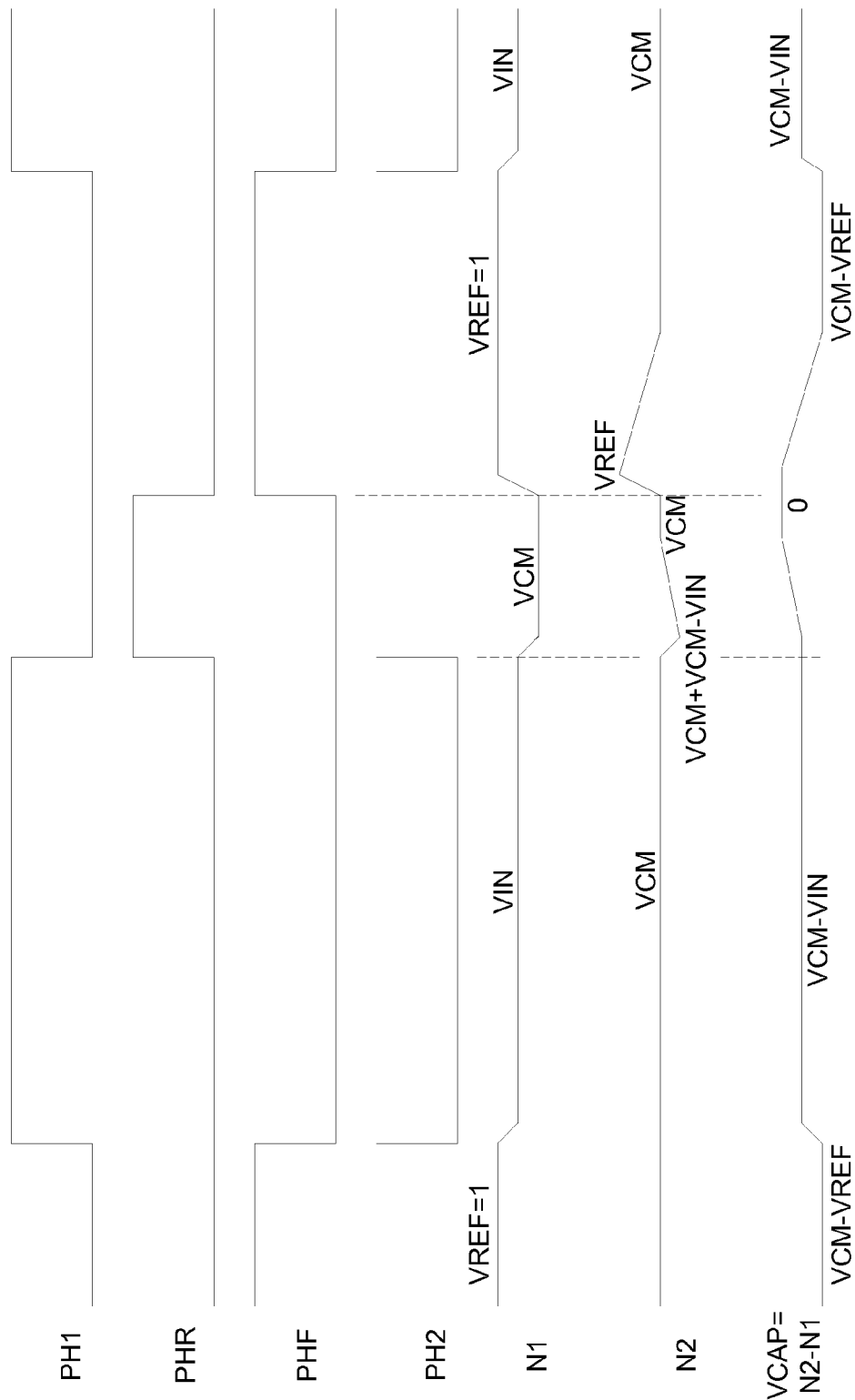
FIG. 3 is another timing diagram illustrating the operation of the circuitry in FIG. 1.

FIG. 3 is another timing diagram illustrating the operation of the circuitry in FIG. 1. In this example, VIN remains high, while the reference voltage VREF, which can be the output of a one-bit digital-to-analog converter or comparator, is high. Again, when PH1 is high, node N1 is equal to VIN while node N2 is equal to VCM.

When PH1 returns low, PHR and PH2 are asserted high. At this time, node N1 is connected to VCM, while node N2 is connected to an output terminal. Again, the voltage across the capacitor cannot change instantaneously, and thus node N2 is driven to twice VCM minus VIN. After enough time, the integrator drives node N2 to VCM and the net voltage across the capacitor is zero.

When PHR returns low, PHF is asserted and node N1 is coupled to VREF. Again, the voltage across the capacitor does not change instantaneously, therefore, since the voltage across the capacitor is zero, node N2 is driven to VREF. Again, this voltage settles to VCM, at which time the voltage across the capacitor is equal to VCM minus VREF. Again, in this case, the lowest voltage that node N2 reaches is twice VCM minus VIN. Where VCM is 2.5V and VIN is 4.0, this voltage is equal to 1.0V. The highest the voltage reaches is VREF, which in this case is equal to the positive supply voltage. In this way, excessive transient voltages on node N2, which may cause clamping and loss of signal, are avoided.

Figure 4:
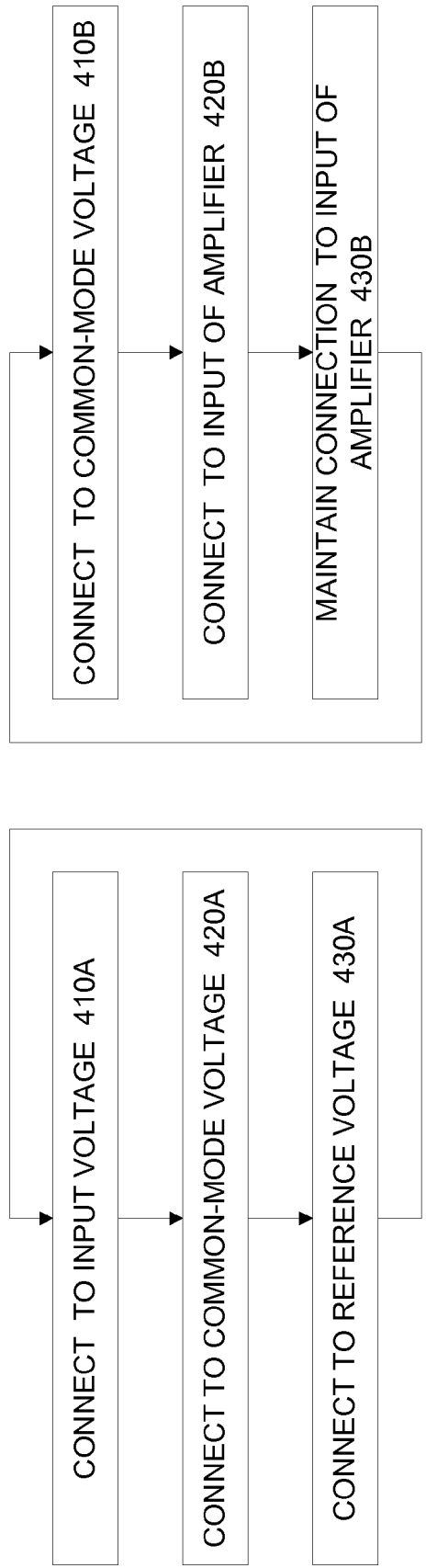
FIG. 4 is a flow chart illustrating the operation of a sampling network according to an embodiment of the present invention.

FIG. 4 is a flow chart illustrating the operation of an embodiment of the present invention. In acts 410A and 410B, the first terminal of the capacitor is connected to an input voltage, while a second terminal of the capacitor is connected to a common mode voltage. In acts 420A and 420B, the first terminal of the capacitor is connected to the common mode voltage, while a second terminal the capacitor is connected to an output, which in this example is connected to an input of an integrating amplifier. In act 430A and 430B, the first terminal of the capacitor is connected to a reference voltage, while the second terminal of the capacitor maintains the connection to the output terminal.

Sampling networks provided by embodiments of the present invention may be used in many applications, such as switched capacitor filters, sample and hold circuits, and sigma delta modulators. One example is shown in the following figure.

Figure 5:
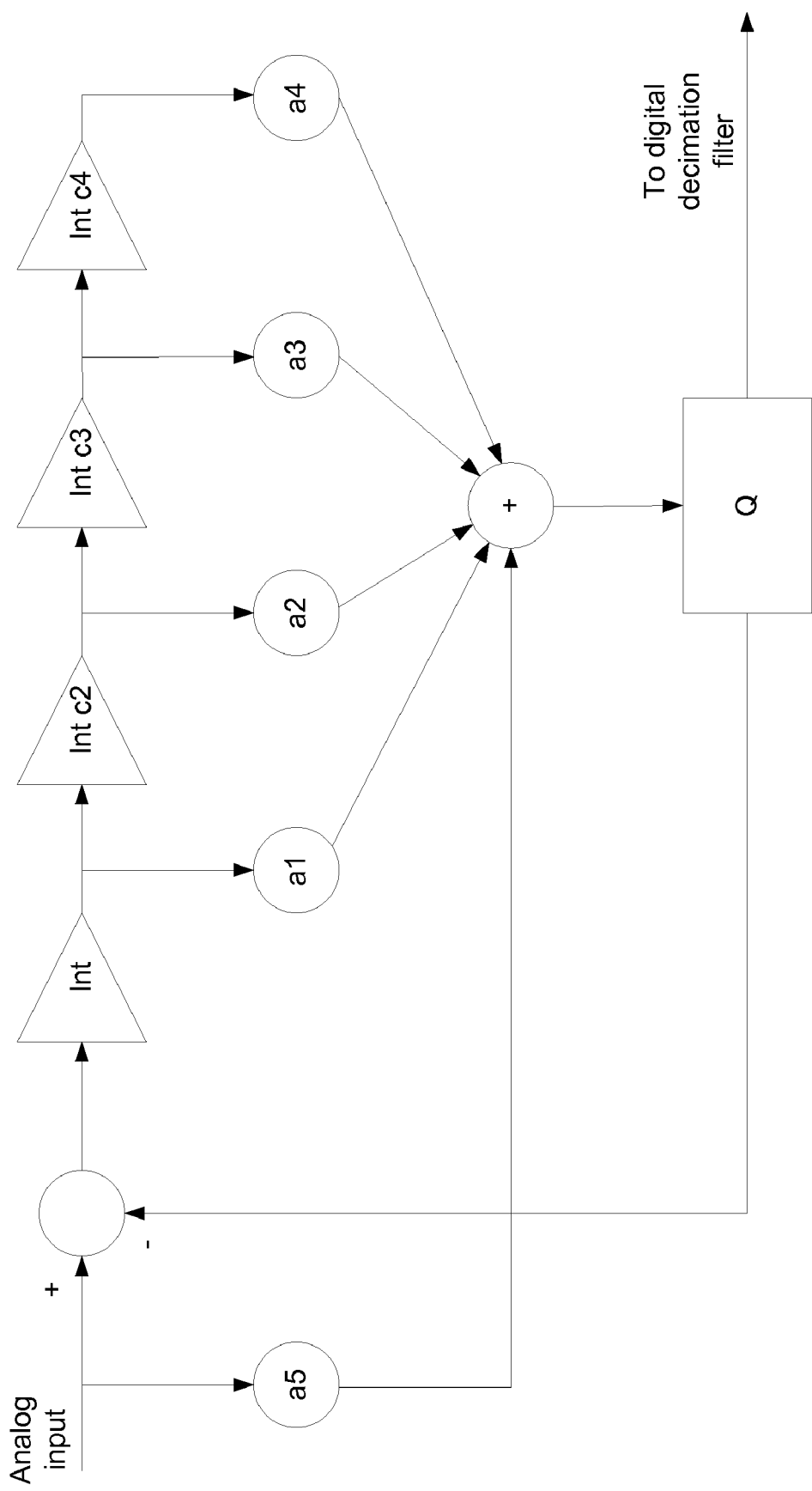
FIG. 5 illustrates a sigma delta modulator (SDM) that may be improved by the incorporation of an embodiment of the present invention.

FIG. 5 illustrates a sigma delta modulator (SDM) that may be improved by the incorporation of an embodiment of the present invention. This particular example is a 4th order cascaded integrator feed forward (CIFF) sigma delta modulator. In this example, the summing node and input integrator may be implemented using the circuitry of FIG. 1. In this figure, integrators (ints) feed gain stages a1-a5, whose outputs are summed and fed in turn to a quantizer Q.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit including a sampling network comprising:
    a first capacitor having a first node and a second node;
    a first switch transistor coupled between an input terminal and the first node of the first capacitor;
    a second switch transistor coupled to the second node of the first capacitor;
    a third switch transistor coupled between a reference voltage terminal and the first node of the first capacitor;
    a fourth switch transistor coupled between a first bias voltage terminal and the second node of the first capacitor; and
    a fifth switch transistor coupled between the first bias voltage terminal and the first node of the first capacitor.

2. The integrated circuit of claim 1 wherein the reference voltage terminal is coupled to the output of a one-bit digital-to-analog converter.

3. The integrated circuit of claim 1 wherein the reference voltage terminal is coupled to the output of a comparator.

4. The integrated circuit of claim 2 wherein the integrated circuit includes a sigma-delta modulator comprising the sampling network and the one-bit digital-to-analog converter.

5. The integrated circuit of claim 1 wherein the first switch transistor and the fourth switch transistor are closed, then later the fifth switch transistor and the second switch transistor are closed, and then later the third switch transistor and the second switch transistor are closed.

6. The integrated circuit of claim 5 wherein the first bias voltage is approximately one-half of a positive power supply voltage.

7. The integrated circuit of claim 1 wherein the second switch transistor is coupled between an integrator and the second node of the first capacitor.

8. The integrated circuit of claim 7 wherein the integrator comprises an amplifier and a second capacitor coupled between an inverting input and an output of the amplifier.

9. A method of sampling a input signal at an input signal terminal comprising:
    coupling a first node of a first capacitor to the input terminal; and
    coupling a second node of the first capacitor to a common-mode voltage; then
    coupling the first node of the first capacitor to the common-mode voltage; and
    coupling the second node of the first capacitor to an output terminal; then
    coupling the first node the first capacitor to a reference voltage; and
    continuing to couple the second node of the first capacitor to the output terminal.

10. The method of claim 9 wherein the reference voltage is provided by a one-bit digital-to-analog converter.

11. The method of claim 9 wherein the reference voltage is provided by a comparator.

12. The method of claim 10 wherein the integrated circuit includes a sigma-delta modulator comprising the sampling network and the one-bit digital-to-analog converter.

13. The method of claim 9 wherein the common-mode voltage is approximately one-half of a positive power supply voltage.

14. The method of claim 9 wherein the output terminal is coupled to an integrator.

15. The method of claim 14 wherein the integrator comprises an amplifier and a second capacitor coupled between an inverting input and an output of the amplifier.

16. An integrated circuit including a sampling network comprising:
    a first capacitor having a first node and a second node;
    a first switch to couple an input to the first node of the first capacitor;
    a second switch to couple the second node of the first capacitor to an output;
    a third switch to couple a reference voltage to the first node of the first capacitor;
    a fourth switch to couple a first bias voltage to the second node of the first capacitor; and
    a fifth switch to couple the first bias voltage to the first node of the first capacitor.

17. The integrated circuit of claim 16 wherein the reference voltage is provided by a one-bit digital-to-analog converter.

18. The integrated circuit of claim 16 wherein the reference voltage is provided by a comparator.

19. The integrated circuit of claim 16, wherein the first switch and the fourth switch are closed, then later the fifth switch and the second switch are closed, and then later the third switch and the second switch are closed.

20. The integrated circuit of claim 19 wherein the first bias voltage is approximately one-half of a positive power supply voltage.

21. The integrated circuit of claim 16 wherein the second switch is coupled between an integrator and the second node of the first capacitor.

22. The integrated circuit of claim 21 wherein the integrator comprises an amplifier and a second capacitor coupled between an inverting input and an output of the amplifier.

* * * * *